United States Patent
Kim et al.

(10) Patent No.: US 10,424,518 B2
(45) Date of Patent: Sep. 24, 2019

(54) INTEGRATED CIRCUIT DESIGNING SYSTEM AND A METHOD OF MANUFACTURING AN INTEGRATED CIRCUIT

(71) Applicant: SAMSUNG ELECTRONICS CO., LTD., Suwon-si, Gyeonggi-do (KR)

(72) Inventors: Tae Il Kim, Goyang-si (KR); Hyung-Ock Kim, Seoul (KR); Woo Young Noh, Yongin-si (KR); Jung Yun Choi, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 235 days.

(21) Appl. No.: 15/477,182

(22) Filed: Apr. 3, 2017

(65) Prior Publication Data
US 2018/0068907 A1    Mar. 8, 2018

(30) Foreign Application Priority Data

Sep. 8, 2016    (KR) .......................... 10-2016-0115714

(51) Int. Cl.
| | |
|---|---|
| *H01L 21/66* | (2006.01) |
| *G03F 7/20* | (2006.01) |
| *H01L 21/02* | (2006.01) |
| *G06F 17/50* | (2006.01) |

(52) U.S. Cl.
CPC .......... *H01L 22/20* (2013.01); *G03F 7/70483* (2013.01); *G03F 7/70616* (2013.01); *G06F 17/5068* (2013.01); *G06F 17/5077* (2013.01); *H01L 21/02035* (2013.01)

(58) Field of Classification Search
CPC .............. H01L 22/20; H01L 21/02035; G03F 7/70483; G03F 7/70616; G06F 17/5077; G06F 17/5068

See application file for complete search history.

(56) References Cited

U.S. PATENT DOCUMENTS

| | | | |
|---|---|---|---|
| 6,473,885 B1 | 10/2002 | Wallace | |
| 7,398,490 B2 | 7/2008 | Wallace | |
| 7,814,452 B1 * | 10/2010 | Jang ................... | G06F 17/5054 |
| | | | 716/100 |
| 7,921,392 B2 | 4/2011 | Furnish et al. | |
| 7,996,812 B2 | 8/2011 | Kotecha et al. | |
| 8,015,522 B2 | 9/2011 | Wang et al. | |
| 8,069,431 B1 | 11/2011 | Zhang | |
| 8,151,229 B1 | 4/2012 | Chang et al. | |

(Continued)

FOREIGN PATENT DOCUMENTS

| | | |
|---|---|---|
| JP | 4350789 | 10/2009 |
| KR | 1020170018189 | 2/2017 |

*Primary Examiner* — Nha T Nguyen
(74) *Attorney, Agent, or Firm* — F. Chau & Associates, LLC

(57) ABSTRACT

A method of manufacturing an integrated circuit may include placing cells, based on input data defining the integrated circuit, performing a pin reordering operation on a plurality of pins in a first cell of the cells, based on physical information regarding the pins in the first cell, wherein the physical information is determined based on the placement of the cells, performing a routing operation on the cells after the pin reordering operation, and manufacturing the integrated circuit, based on a layout produced by the routing operation.

15 Claims, 16 Drawing Sheets

(56) References Cited

U.S. PATENT DOCUMENTS

| | | |
|---|---|---|
| 8,332,793 B2 | 12/2012 | Bose |
| 8,521,483 B1 | 8/2013 | Kukal et al. |
| 2005/0144575 A1* | 6/2005 | Aoki .................. G06F 17/5068 |
| | | 716/123 |
| 2016/0034628 A1 | 2/2016 | Rajendran et al. |
| 2017/0039300 A1 | 2/2017 | Bae et al. |

* cited by examiner

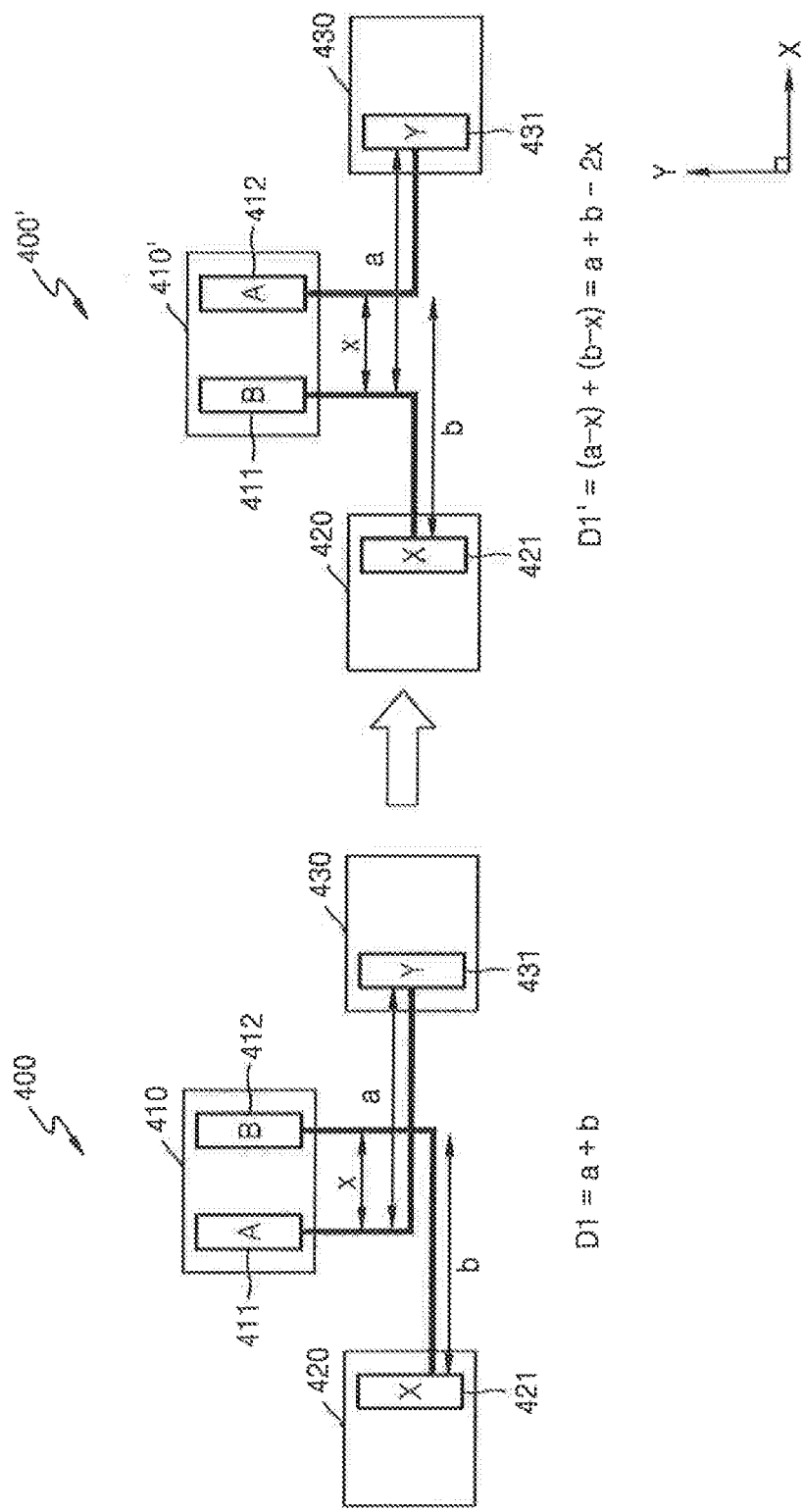

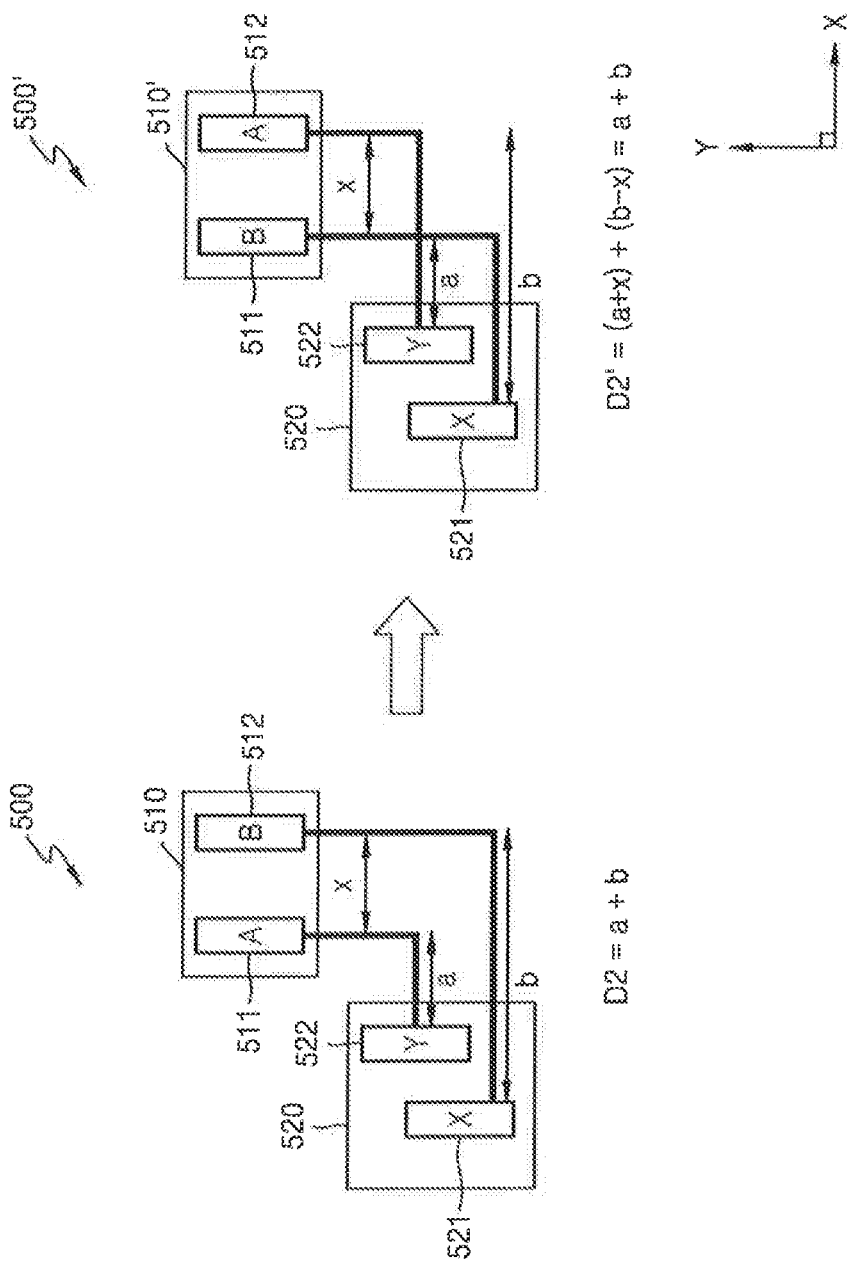

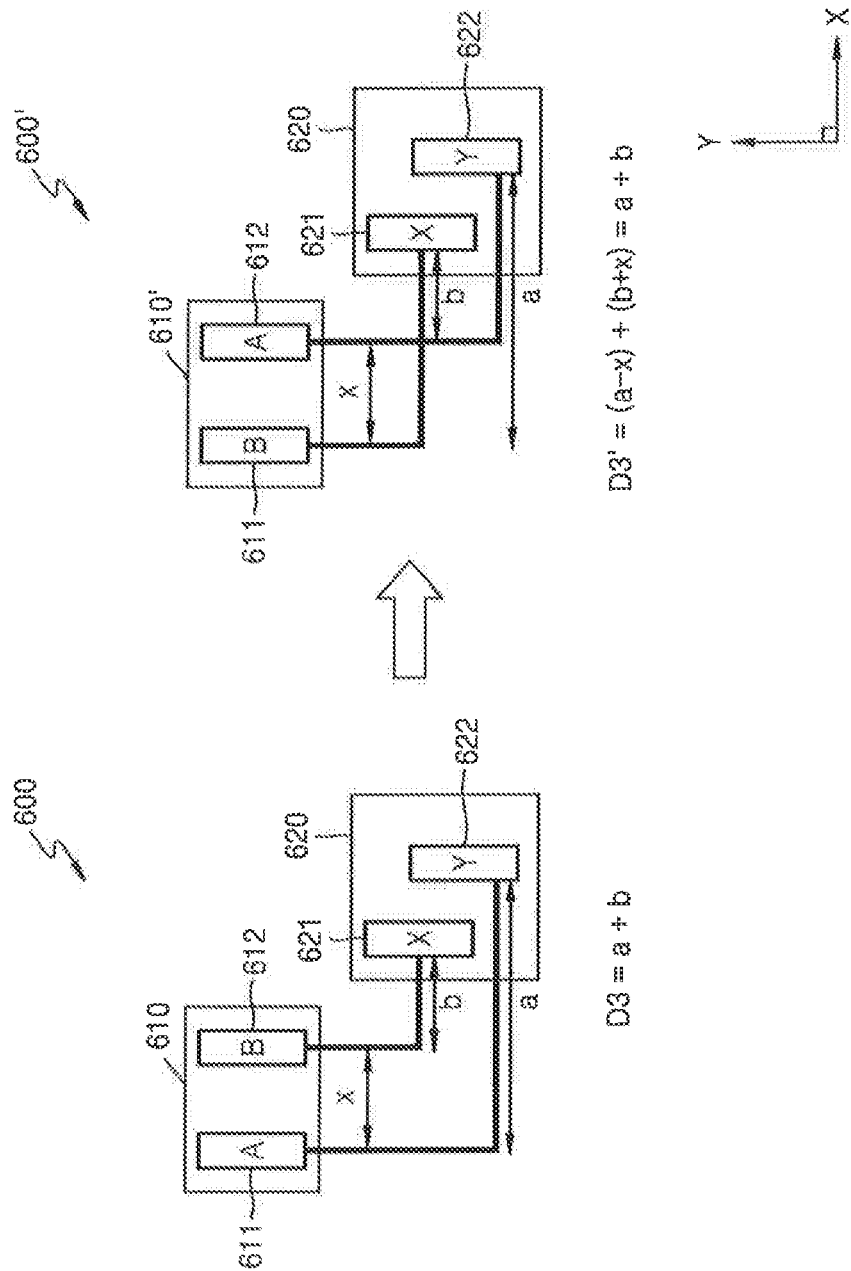

INTEGRATED CIRCUIT DESIGNING SYSTEM AND A METHOD OF MANUFACTURING AN INTEGRATED CIRCUIT

CROSS-REFERENCE TO RELATED APPLICATION

This application claims priority under 35 U.S.C. § 119 to Korean Patent Application No. 10-2016-0115714, filed on Sep. 8, 2016, in the Korean Intellectual Property Office, the disclosure of which is incorporated by reference herein in its entirety.

TECHNICAL FIELD

The inventive concept relates to an integrated circuit, and in particular, to a system of designing an integrated circuit, a computer-implemented method of designing an integrated circuit, and a method of manufacturing an integrated circuit.

DISCUSSION OF RELATED ART

Due to increasing demand for high-performance semiconductor chips, there exists an increase in a pin density of a cell. To make such high-performance chips, a semiconductor microfabrication process is used. However, the number of design rules of a cell increase in the semiconductor microfabrication process. Further, in the case that multi-patterning technology, such as double patterning technology (DPT) and triple patterning technology (TPT), is used in the microfabrication process, local congestion may occur near some of the pins in a cell.

SUMMARY

According to an exemplary embodiment of the inventive concept, there is provided a method of manufacturing an integrated circuit. At least a portion of the method may be performed by a processor. The method may include placing cells, based on input data defining the integrated circuit, performing a pin reordering operation on a plurality of pins in a first cell of the cells, based on physical information regarding the plurality of pins in the first cell, wherein the physical information is determined based on the placement of the cells, performing a routing operation on the cells, after the pin reordering operation, and manufacturing the integrated circuit, based on a layout produced by the routing operation.

According to an exemplary embodiment of the inventive concept, there is provided an integrated circuit designing system. The system may include a processor and a memory which is connected to the processor and is configured to store instructions. The instructions may be used to perform a placement and routing operation for designing an integrated circuit. The instructions may be configured to instruct the processor to perform operations to: place cells defining the integrated circuit, perform a pin reordering operation on a plurality of pins in at least one cell of the cells, based on physical information of the pins obtained by the placing of the cells, and perform a routing operation on the cells, on which the pin reordering operation has been performed.

According to an exemplary embodiment of the inventive concept, there is provided a method of manufacturing an integrated circuit comprising: arranging cells in a first layout, wherein, in the first layout, a first cell has first and second pins, the first pin to be wired to a first pin of a second cell and the second pin to be wired to a first pin of a third cell; reordering the first pin of the first cell to be wired to the first pin of the third cell and the second pin of the first cell to be wired to the first pin of the second cell, wherein the first and second pins of the first cell are reordered based on their locations with respect to the second and third cells in the first layout; performing a routing operation on the first, second and third cells to produce a second layout according to the reordering, wherein, in the second layout, the first pin of the first cell is to be wired to the first pin of the third cell and the second pin of the first cell is to be wired to the first pin of the second cell; and manufacturing an integrated circuit based on the second layout.

BRIEF DESCRIPTION OF THE DRAWINGS

The above and other features of the inventive concept will become more clearly understood by describing in detail exemplary embodiments thereof with reference to the accompanying drawings in which:

FIGS. 13, 14 and 15 each illustrate a pin reordering operation according to an exemplary embodiment of the inventive concept;

DETAILED DESCRIPTION OF THE EMBODIMENTS

Figure 1:
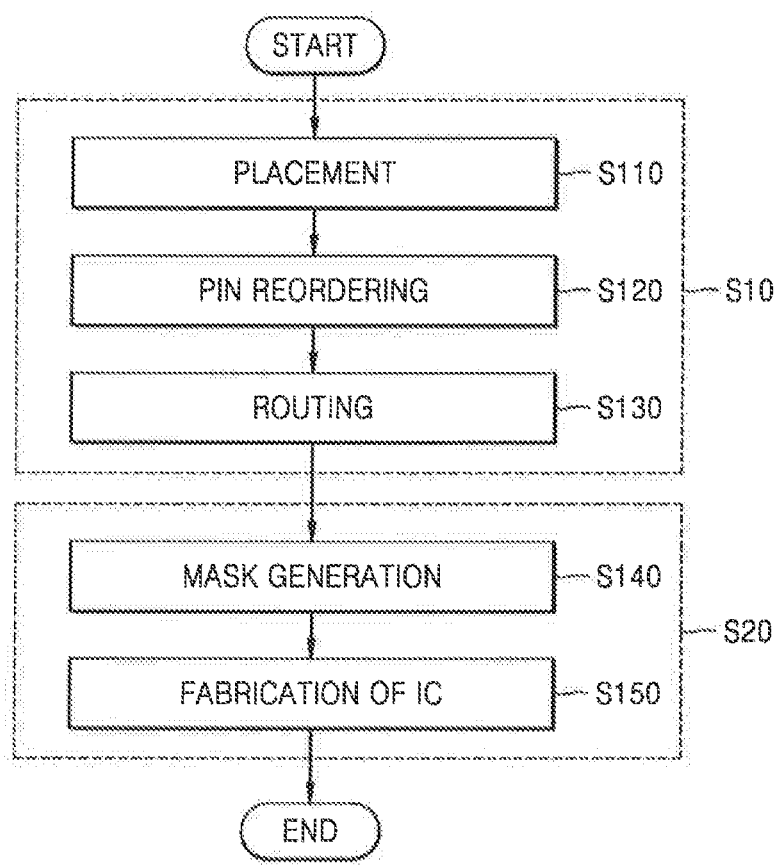
FIG. 1 is a flowchart illustrating a method of manufacturing an integrated circuit, according to an exemplary embodiment of the inventive concept.

FIG. 1 is a flowchart illustrating a method of manufacturing an integrated circuit, according to an exemplary embodiment of the inventive concept.

Referring to FIG. 1, a method of manufacturing an integrated circuit (IC) according to the present embodiment may include an IC designing process S10 and an IC manufacturing process (S20). The IC designing process S10 may be performed to prepare a layout for ICs and may include operations S110, S120, and S130, which are performed using an IC design tool. Here, the IC design tool may be a program including a plurality of instructions to be executed by a processor. Accordingly, the IC designing process S10 may be a computer implemented method of designing ICs. The IC manufacturing process S20 may be an operation of manufacturing a semiconductor device including ICs, based on a designed layout, and may be performed in a semiconductor process module.

An IC may be defined by a plurality of cells and may be designed using a cell library containing information regarding the plurality of cells. Various data associated with the cells (e.g., name, dimension, gate width, pin, delay property, leakage current, threshold voltage, function, and so forth) may be defined in the cell library. In an exemplary embodiment of the inventive concept, the cell library may be a standard cell library. The standard cell library may include information regarding a plurality of standard cells (e.g., layout and timing information) and may be stored in a computer-readable storage medium.

In operation S110, standard cells defining an IC may be placed. For example, operation S110 may be performed using a placement and routing (P&R) tool and by a processor. For example, operation S110 may include receiving input data defining the IC. Here, the input data may be generated from data defined in an abstract form of a behavior of the IC (e.g., data defined in a register transfer level (RTL)), through synthesis using the standard cell library. For example, the input data may be a bitstream or netlist which is generated by synthesizing an IC defined by a hardware description language (HDL) (e.g., a VHSIC HDL (VHDL) and Verilog). Operation S110 may further include accessing the storage medium, in which the standard cell library is stored, and placing standard cells that are selected from a plurality of standard cells in the standard cell library based on the input data.

In operation S120, based on physical information according to the placement of the standard cells, a pin reordering operation may be performed on pins in at least one of the placed standard cells. The pin reordering operation may reorder at least two pins that are functionally or logically equivalent. For example, the pin reordering operation may re-assign first and second pins, which are assigned to a pin "A" and a pin "B" respectively, to the pin "B" and the pin "A", respectively. Since the connection structures to two pins are swapped by the pin reordering operation, the pin reordering operation may be called a 'pin swapping operation'.

In the pin reordering operation, the physical information according to the placement of the standard cells may be physical information regarding a plurality of pins in the placed standard cells. In an exemplary embodiment of the inventive concept, the physical information may include information regarding positions of the pins. In an exemplary embodiment of the inventive concept, the physical information may contain information regarding spaces between the pins. The pin reordering operation will be described in more detail with reference to FIGS. 2 to 6.

In operation S130, a routing operation may be performed on the standard cells, on which the pin reordering operation has been performed. For example, the routing operation may be performed on a plurality of nets included in the placed standard cells. Here, each of the nets may represent an equipotential structure in an equivalent circuit diagram of the IC. A single net may correspond to a single interconnection in an IC layout, and the single interconnection may correspond to an interconnection structure including a plurality of interconnection layers and vias that are electrically connected to each other. Each of the interconnection layers may include a plurality of conductive patterns, and the conductive patterns of the interconnection layers at different levels may be connected to each other through conductive vias. An interconnection layer may include a conductive material (e.g., metals) and may be referred to as a metal layer. However, in an exemplary embodiment of the inventive concept, at least one of the interconnection layers may include a non-metallic conductive material.

After operation S130, output data defining the IC may be provided to the semiconductor process module. Here, the output data may be prepared to contain information regarding all layouts of the standard cells (e.g., information regarding patterns in all layers). For example, the output data may be of a graphic design system II (GDS-II) format. Additionally, the output data may contain information regarding an element outside the standard cell (e.g., on the pin of the standard cell). For example, the output data may be of a library exchange format (LEF) or Milkyway format.

The IC designing process S10 may include operations S110 to S130, but the inventive concept is not limited thereto. For example, the IC designing process S10 may further include at least one of various operations that are performed in a general IC designing method (e.g., operations of creating and modifying the standard cell library and verifying the layout). In addition, a front-end design process may be performed before operation S110, and operations S110 to S130 may be performed as a back-end design process of the IC design process. The front-end design process may include at least one of operations for determination of design specifications, behavior-level modeling and verification, RTL design, functional verification, logic synthesis, gate-level verification (or pre-layout simulation), and so forth.

In operation S140, a mask may be generated on the basis of the layout. For example, an optical proximity correction (OPC) process may be performed on the basis of the layout. Here, the OPC process may be a process of revising the layout to reduce an error, which may be caused by an optical proximity effect. Thereafter, a mask may be manufactured on the basis of the layout revised by the OPC process. Here, the OPC-based revised layout (e.g., GDS data revised in consideration of the OPC effect) may be used to manufacture the mask.

In operation S150, the IC may be fabricated using the mask. For example, a semiconductor process using the mask may be performed on a semiconductor substrate (e.g., a wafer) to form a semiconductor device with the IC. The process of using the mask may be a patterning process including a lithography operation. As a result of the patterning process, a desired pattern may be formed on the semiconductor substrate or a material layer. In an exemplary embodiment of the inventive concept, the semiconductor process may include a deposition process, an etching process, an ion implantation process, a cleaning process, and so forth. Furthermore, the semiconductor process may include at least one of a packaging process, which includes operations of mounting the semiconductor device on a printed circuit board (PCB) and encapsulating the semiconductor device with an encapsulating material, or a test process of testing the semiconductor device or the package.

Figure 2:
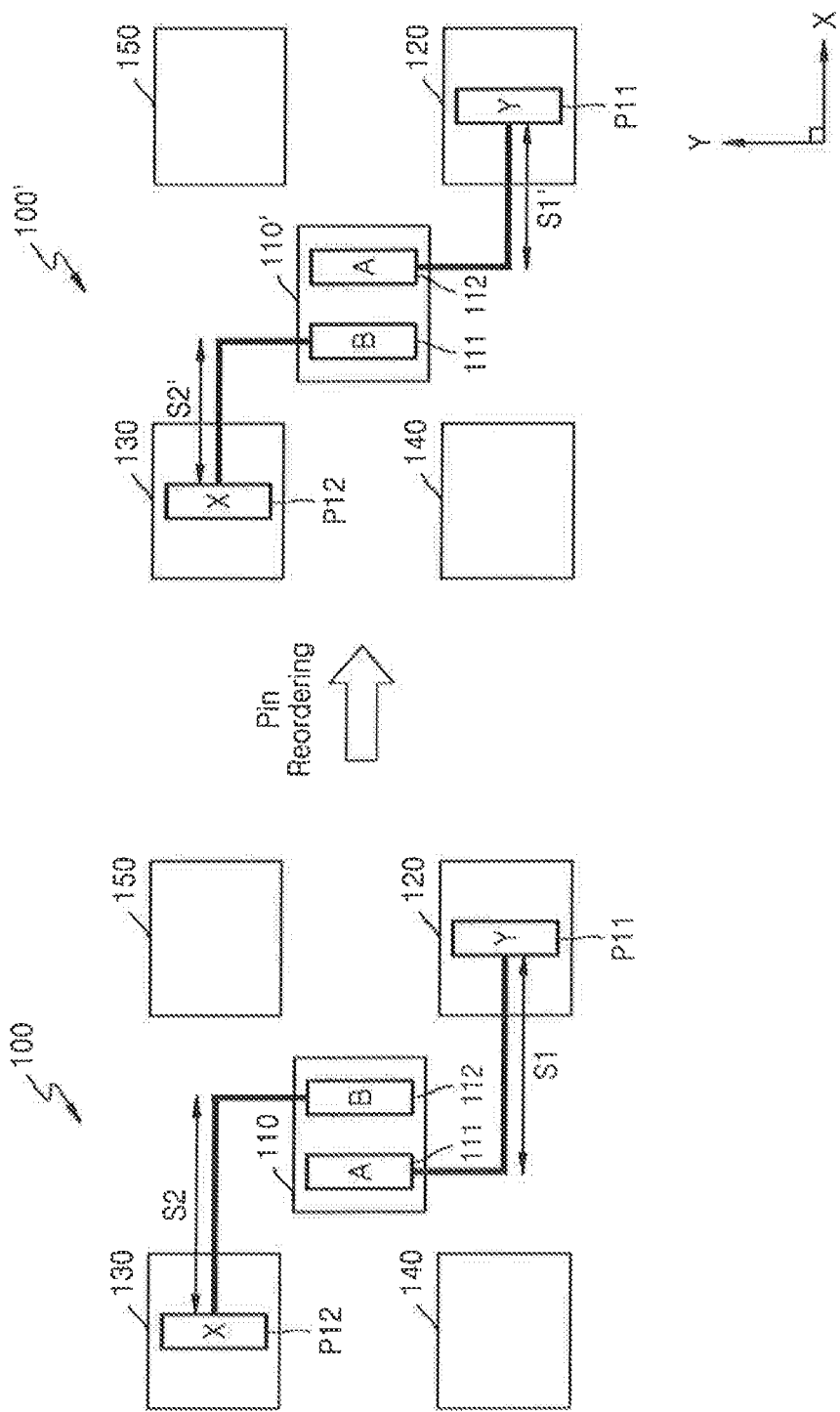
FIG. 2 illustrates a pin reordering operation according to an exemplary embodiment of the inventive concept.

FIG. 2 illustrates a pin reordering operation according to an exemplary embodiment of the inventive concept.

Referring to FIG. 2, a first layout 100 may refer to a layout, which is at a stage before the pin reordering operation, and may be produced by, for example, operation S110 of FIG. 1. The first layout 100 may have a pin connection structure realized by a global routing. A second layout 100' may refer to a layout, which is at a stage after the pin reordering operation, and may be produced by, for example, operation S120 of FIG. 1. The second layout 100' may have a pin connection structure realized by a new routing through the pin reordering operation. According to the present embodiment, in the first layout 100, first and second pins 111 and 112 may be respectively assigned to a pin "A" and a pin "B", and in the second layout 100', the first and second pins 111 and 112 may be respectively re-assigned to the pin "B" and the pin "A".

The first layout 100 may include first to fifth cells 110, 120, 130, 140, and 150. Here, the first cell 110 may include pins 111 and 112, the second cell 120 may include a pin P11, and the third cell 130 may include a pin P12. Positions of the first to fifth cells 110 to 150 and the pins 111, 112, P11, and P12 may be determined depending on the placement of the first to fifth cells 110 to 150, and thus, physical information regarding the plurality of pins 111, 112, P11, and P12 may be obtained.

In the present embodiment, the pins 111 and 112 of the first cell 110 may be input pins, which are logically equivalent, and may be assigned to the pin "A" and the pin "B", respectively. Hereinafter, the pins 111 and 112 of the first cell 110 may be referred to as 'first and second input pins 111 and 112', respectively. The first and second input pins 111 and 112 may be gate input pins, and thus, the pins P11 and P12, which are respectively connected to the first and second input pins 111 and 112, may be referred to as 'first and second fan-in pins P11 and P12', respectively. However, the inventive concept is not limited to the pin reordering operation performed on the input pins, and in an exemplary embodiment of the inventive concept, the pin reordering operation may be performed on any pins that are logically equivalent. In addition, the pin reordering operation according to an exemplary embodiment of the inventive concept is not limited to a pair of pins and may be performed on two or more pins.

In an exemplary embodiment of the inventive concept, the physical information may contain information regarding a space S1 between the first input pin 111 and the first fan-in pin P11, a space S2 between the second input pin 112 and the second fan-in pin P12, a space S1' between the second input pin 112 and the first fan-in pin P11, and a space S2' between the first input pin 111 and the second fan-in pin P12. Here, the spaces S1, S2, S1', and S2' may be values in a first direction (e.g., an X direction) and thus may be 'horizontal spaces'. The first direction may be parallel to, for example, an extension direction of power rails provided in the first to fifth cells 110 to 150. As shown in FIG. 2, the first fan-in pin P11 is assigned to pin "Y" and the second fan-in pin P12 is assigned to pin "X".

According to the present embodiment, the physical information regarding the pins may be used to estimate whether routing congestion can be reduced by the pin reordering operation. The result of the prediction may be used to determine whether to perform the pin reordering operation. For example, the pin reordering operation to be performed on the first and second input pins 111 and 112 may lead to a reduction in the sum of lengths of wires, which are connected to the first and second input pins 111 and 112. In this case, the routing congestion may be reduced by the pin reordering operation. Accordingly, the pin reordering operation of re-assigning the first and second input pins 111 and 112 to the pin "B" and the pin "A", respectively, may be performed to produce the second layout 100', and then, the second layout 100' may be provided for operation S130 of FIG. 1.

Figure 3:
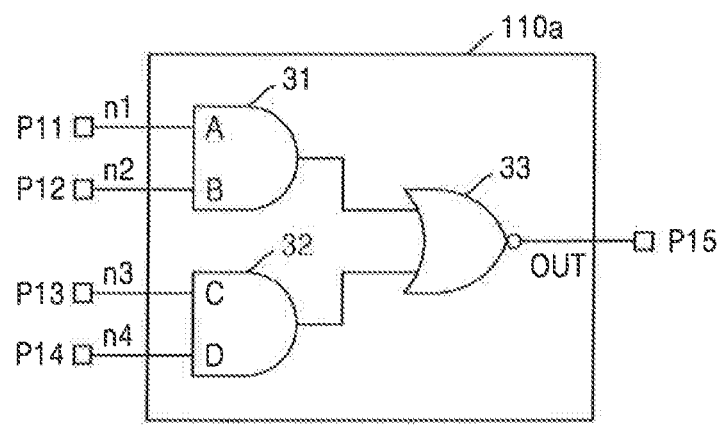
FIG. 3 illustrates a first cell of FIG. 2 according to an exemplary embodiment of the inventive concept.

FIG. 3 illustrates a first cell 110a which is an example of the first cell 110 of FIG. 2.

Referring to FIG. 3, the first cell 110a may be an AOI22 cell, in which first and second AND gates 31 and 32 and a NOR gate 33 are provided. The first cell 110a may include first to fourth input pins "A", "B", "C", and "D", which are connected to first to fourth fan-in pins P11, P12, P13, and P14, respectively. In addition, the first cell 110a may include an output pin OUT, which is connected to a fan-out pin P15.

According to the present embodiment, since the first and second input pins "A" and "B" are logically equivalent, the first and second input pins "A" and "B" may correspond to pin-reordering target pins and the first cell 110a may correspond to a pin-reordering target cell. In an exemplary embodiment of the inventive concept, information regarding lengths of first and second nets n1 and n2, which are respectively connected to the first and second input pins "A" and "B", may be used to determine whether to perform the pin reordering operation on the first and second input pins "A" and "B". For example, by reordering the first and second input pins "A" and "B" in a manner illustrated in FIG. 2, it may be possible to reduce routing congestion. Accordingly, it may be possible to reduce a length of each of the first and second nets n1 and n2 and accordingly, reduce signal delay.

Furthermore, according to the present embodiment, since the third and fourth input pins "C" and "D" are logically equivalent, the third and fourth input pins "C" and "D" may correspond to pin-reordering target pins and the first cell 110a may correspond to a pin-reordering target cell. In an exemplary embodiment of the inventive concept, information regarding lengths of third and fourth nets n3 and n4, which are respectively connected to the third and fourth input pins "C" and "D", may be used to determine whether to perform the pin reordering operation on the third and fourth input pins "C" and "D". For example, by reordering the third and fourth input pins "C" and "D" in a manner illustrated in FIG. 2, it may be possible to reduce routing congestion. Accordingly, it may be possible to reduce a length of each of the third and fourth nets n3 and n4 and accordingly, reduce signal delay.

Figure 4:
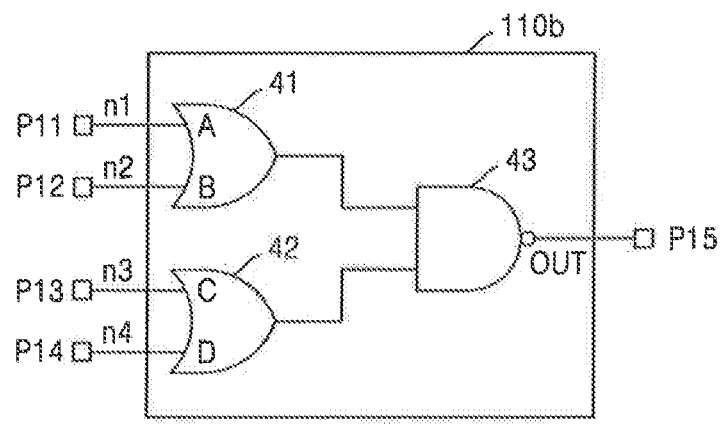
FIG. 4 illustrates a first cell of FIG. 2 according to an exemplary embodiment of the inventive concept.

FIG. 4 illustrates a first cell 110b which is an example of the first cell 110 of FIG. 2.

Referring to FIG. 4, the first cell 110b may be an OAI22 cell, in which first and second OR gates 41 and 42 and a NAND gate 43 are provided. The first cell 110b may include first to fourth input pins "A", "B", "C", and "D", which are connected to first to fourth fan-in pins P11, P12, P13, and P14, respectively. In addition, the first cell 110b may include an output pin OUT, which is connected to a fan-out pin P15.

According to the present embodiment, since the first and second input pins "A" and "B" are logically equivalent, the first and second input pins "A" and "B" may correspond to pin-reordering target pins and the first cell 110b may correspond to a pin-reordering target cell. In an exemplary embodiment of the inventive concept, information regarding lengths of first and second nets n1 and n2, which are respectively connected to the first and second input pins "A"

and "B", may be used to determine whether to perform the pin reordering operation on the first and second input pins "A" and "B".

Furthermore, according to the present embodiment, since the third and fourth input pins "C" and "D" are logically equivalent, the third and fourth input pins "C" and "D" may correspond to pin-reordering target pins and the first cell 110*b* may correspond to a pin-reordering target cell. In an exemplary embodiment of the inventive concept, information regarding lengths of third and fourth nets n3 and n4, which are respectively connected to the third and fourth input pins "C" and "D", may be used to determine whether to perform the pin reordering operation on the third and fourth input pins "C" and "D".

Figure 5:
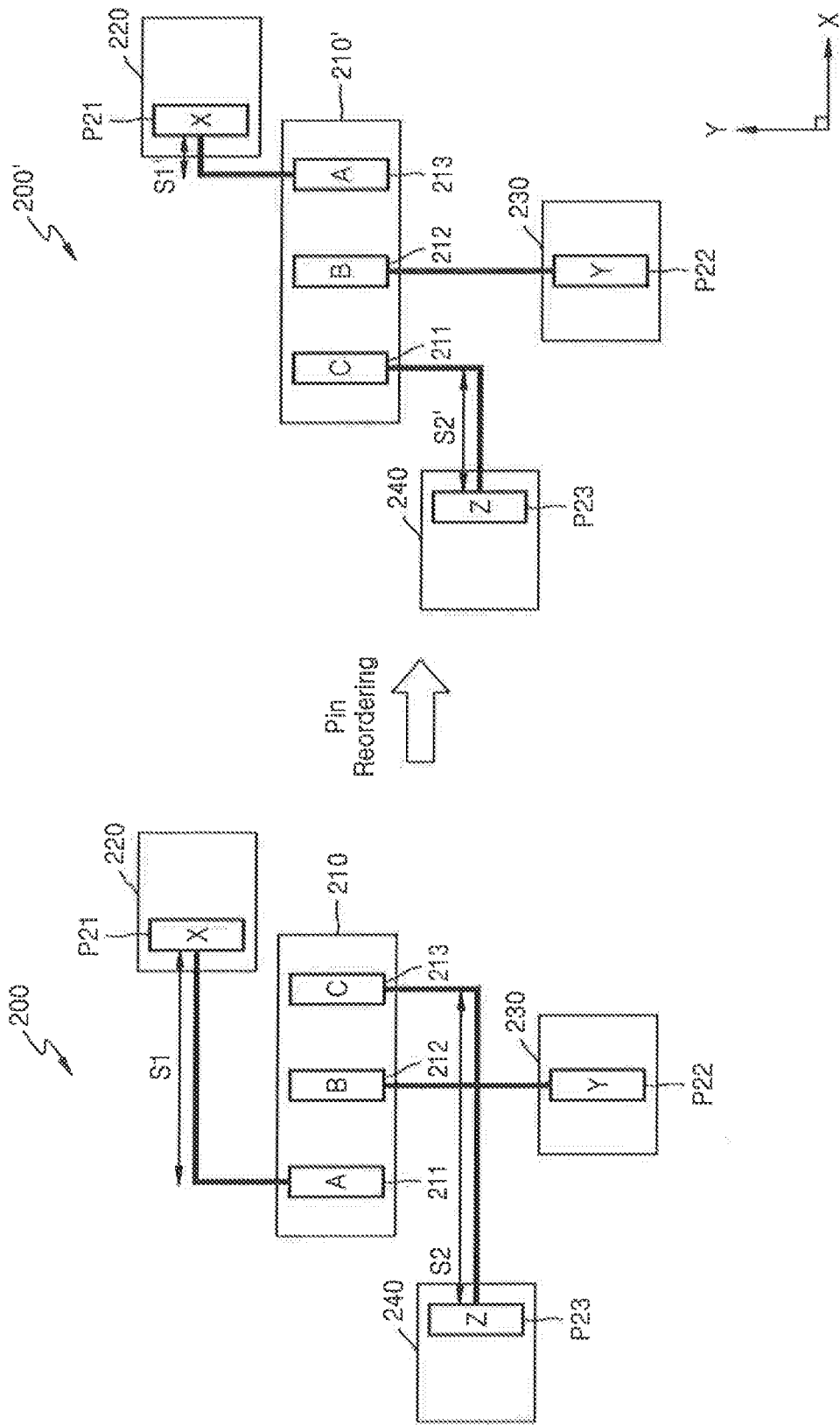
FIG. 5 illustrates a pin reordering operation according to an exemplary embodiment of the inventive concept.

FIG. 5 illustrates a pin reordering operation according to an exemplary embodiment of the inventive concept.

Referring to FIG. 5, a first layout 200 may refer to a layout, which is at a stage before the pin reordering operation, and may be produced by, for example, operation S110 of FIG. 1. The first layout 200 may have a pin connection structure realized by a global routing. A second layout 200' may refer to a layout, which is at a stage after the pin reordering operation, and may be produced by, for example, operation S120 of FIG. 1. The second layout 200' may have a pin connection structure realized by a new routing through the pin reordering operation. According to the present embodiment, in the first layout 200, first to third pins 211, 212, and 213 may be assigned to a pin "A", a pin "B", and a pin "C", respectively, and in the second layout 200', the first and third pins 211 and 213 may be respectively re-assigned to the pin "C" and the pin "A". The pin "B" may be assigned to the second pin 212 in both the first layout 200 and the second layout 200'.

The first layout 200 may include first to fourth cells 210, 220, 230, and 240. Here, the first cell 210 may include the pins 211 to 213, the second cell 220 may include a pin P21, the third cell 230 may include a pin P22, and the fourth cell 240 may include a pin P23. Positions of the first to fourth cells 210 to 240 and the pins 211 to 213 and P21 to P23 may be determined depending on the placement of the first to fourth cells 210 to 240, and thus, physical information regarding the pins 211 to 213 and P21 to P23 may be obtained.

In the present embodiment, the pins 211 to 213 of the first cell 210 may be input pins that are logically equivalent. In other words, the first cell 210 may include three input pins. However, the inventive concept is not limited thereto, and in an exemplary embodiment of the inventive concept, the first cell 210 may include four or more input pins. Hereinafter, the pins 211 to 213 of the first cell 210 may be referred to as 'first to third input pins 211 to 213'. The first to third input pins 211 to 213 may be gate input pins, and thus, the pins P21 to P23, which are respectively connected to the first to third input pins 211 to 213, may be referred to as 'first to third fan-in pins P21 to P23'. As shown in FIG. 5, the first fan-in pin P21 is assigned to pin "X", the second fan-in pin P22 is assigned to pin "Y" and the third fan-in pin P23 is assigned to pin "Z".

In an exemplary embodiment of the inventive concept, the physical information may contain information regarding a space S1 between the first input pin 211 and the first fan-in pin P21, a space S2 between the third input pin 213 and the third fan-in pin P23, a space S1' between the third input pin 213 and the first fan-in pin P21, and a space S2' between the first input pin 211 and the third fan-in pin P23. Here, the spaces S1, S2, S1', and S2' may be values in a first direction (e.g., X direction) and thus may be 'horizontal spaces'.

According to the present embodiment, the physical information may be used to predict whether routing congestion can be reduced by the pin reordering operation. The result of the prediction may be used to determine whether to perform the pin reordering operation. For example, the pin reordering operation to be performed on the first to third input pins 211 to 213 may lead to a reduction in the sum of lengths of wires, which are connected to the first to third input pins 211 to 213. In this case, the routing congestion may be reduced by the pin reordering operation. Accordingly, in this case, the second layout 200' may be produced by the pin reordering operation on the first and third input pins 211 and 213, and then, the second layout 200' may be provided for operation S130 of FIG. 1.

Figure 6:
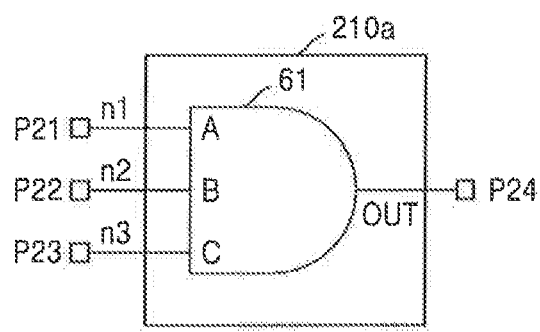
FIG. 6 illustrates a first cell of FIG. 5 according to an exemplary embodiment of the inventive concept.

FIG. 6 illustrates a first cell 210*a* which is an example of the first cell 210 of FIG. 5.

Referring to FIG. 6, the first cell 210*a* may be a cell, in which a 3-input AND gate 61 is provided. The first cell 210*a* may include first to third input pins "A", "B", and "C", which are connected to first to third fan-in pins P21, P22, and P23, respectively. In addition, the first cell 210*a* may include an output pin OUT, which is connected to a fan-out pin P24.

According to the present embodiment, since the first to third input pins "A", "B", and "C" are logically equivalent, the first to third input pins "A", "B", and "C" may respectively correspond to pin-reordering target pins and the first cell 210*a* may correspond to a pin-reordering target cell. In an exemplary embodiment of the inventive concept, information regarding lengths of first to third nets n1, n2, and n3, which are respectively connected to the first to third input pins "A", "B", and "C", may be used to determine whether to perform the pin reordering operation on the first to third input pins "A", "B", and "C". For example, by reordering the first and third input pins "A" and "C" in a manner illustrated in FIG. 5, it may be possible to reduce routing congestion. Accordingly, it may be possible to reduce a length of each of the first and third nets n1 and n3 and accordingly, reduce signal delay.

Figure 7:
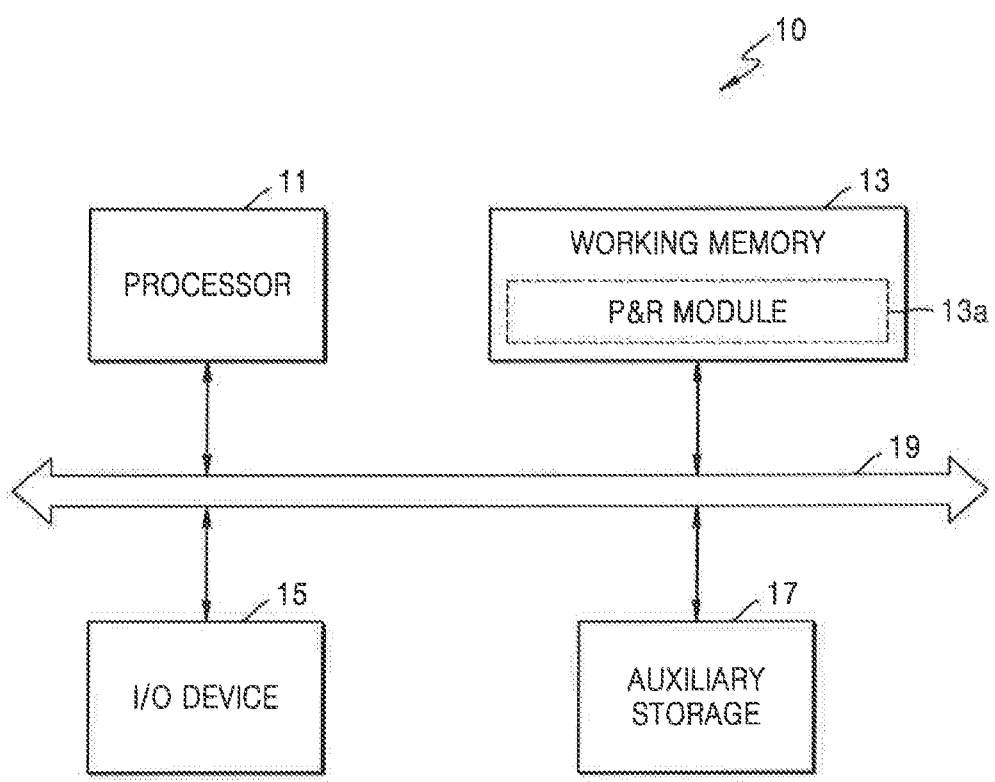
FIG. 7 illustrates an integrated circuit designing system according to an exemplary embodiment of the inventive concept.

FIG. 7 illustrates an IC designing system 10 according to an exemplary embodiment of the inventive concept.

Referring to FIG. 7, the IC designing system 10 may include a processor 11, a working memory 13, an input-output unit (I/O device) 15, a storage device (auxiliary storage) 17, and a bus 19. The IC designing system 10 may perform the IC designing process S10 of FIG. 1. In the present embodiment, the IC designing system 10 may be a single integrated device and thus it may be called an "IC designing device". The IC designing system 10 may be a dedicated device for designing ICs of a semiconductor device, but the IC designing system 10 may be a computer, in which various simulation or design tools can be operated.

The processor 11 may be configured to execute instructions that are used to perform at least one of various operations for designing ICs. The processor 11 may communicate with the working memory 13, the input-output unit 15, and the storage device 17 via the bus 19. A P&R module 13*a* may be loaded on the working memory 13, and the processor 11 may be configured to operate the P&R module 13*a* during an IC designing operation.

The working memory 13 may be configured to store instructions for a P&R operation, which may be performed as a part of the IC designing operation. The instructions stored in the working memory 13 may instruct the processor 11 to perform operations of placing cells defining an IC, to perform a pin reordering operation on a plurality of pins in at least one of the cells, based on physical information of the pins obtained by the placement of the cells, and to perform a routing operation on the cells, on which the pin reordering operation has been performed.

Here, the physical information may contain information regarding positions of or spaces between the plurality of pins in the cells. At least one of the cells may include a plurality of input pins, and at least two of the input pins (e.g., first and second input pins) may be logically equivalent. The first and second pins may be configured to be respectively connected to first and second fan-in pins that are provided outside the at least one of the cells. The physical information may include information regarding spaces between the first pin and the first fan-in pin, between the first pin and the second fan-in pin, between the second pin and the first fan-in pin, and between the second pin and the second fan-in pin.

In an exemplary embodiment of the inventive concept, the working memory 13 may store the P&R module 13a. For example, the P&R module 13a may be transmitted from the storage device 17 and loaded on the working memory 13. The P&R module 13a may be, for example, a program including a plurality of instructions which may be used to perform the placing, pin reordering, and routing operations described with reference to operations S110 to S130 of FIG. 1.

However the inventive concept is not limited thereto. For example, the working memory 13 may store various modules, such as a timing analysis module and a simulation module. The working memory 13 may be a volatile memory device (e.g., static random access memory (SRAM) or dynamic RAM (DRAM)) or a nonvolatile memory (e.g., phase-change RAM (PRAM), magnetoresistive (MRAM), resistive RAM (ReRAM), ferroelectric RAM (FRAM), or NOR FLASH memory).

The input-output unit 15 may control an operation of receiving or sending user data from or to a user interface device. For example, the input-output unit 15 may include an input device (e.g., keyboard, mouse, and touchpad) and may receive input data defining ICs through the input device. In addition, the input-output unit 15 may include an output device (e.g., display and speaker) and may provide output data (e.g., the resulting placement of cells, wires, or ICs, or timing analysis results).

The storage device 17 may store various data associated with the P&R module 13a. The storage device 17 may include a memory card (e.g., multimedia card (MMC), embedded MMC (eMMC), secure digital (SD), MicroSD, and so forth), a solid state drive, a hard disk drive, and so forth.

Figure 8:
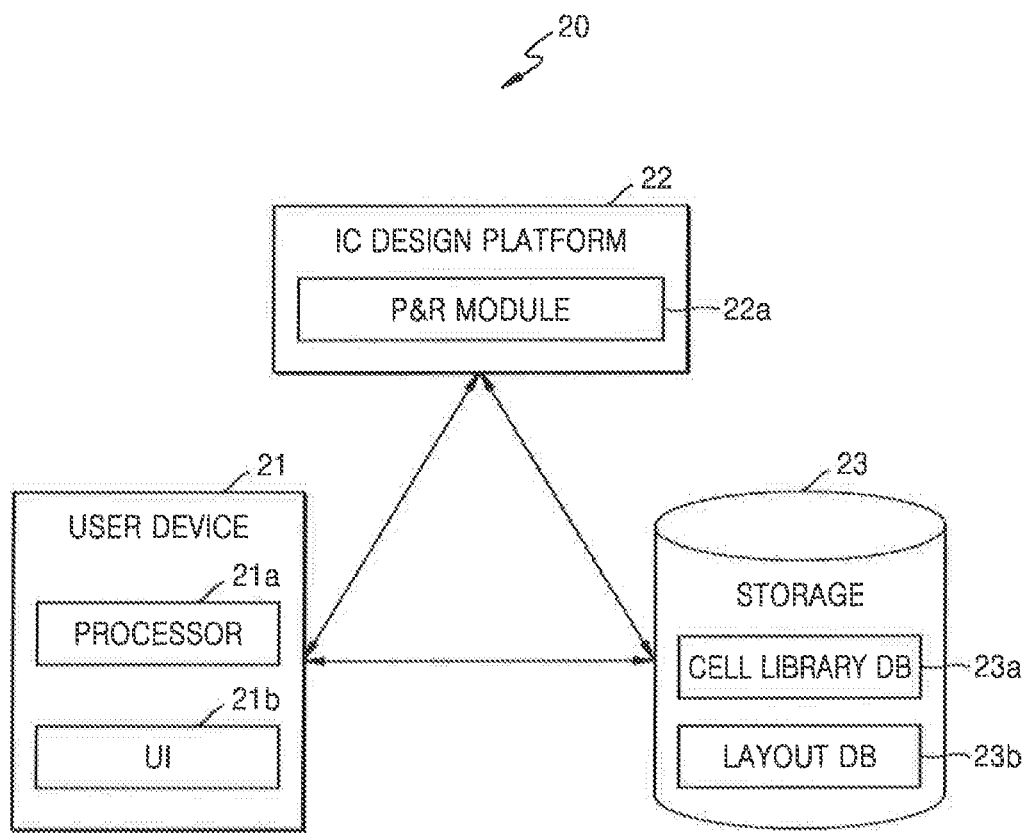
FIG. 8 illustrates an integrated circuit designing system according to an exemplary embodiment of the inventive concept.

FIG. 8 illustrates an IC designing system 20 according to an exemplary embodiment of the inventive concept.

Referring to FIG. 8, the IC designing system 20 may include a user device 21, an IC design platform 22, and a storage device 23. The IC designing system 20 may execute the IC designing process S10 of FIG. 1. In the present embodiment, at least one of the user device 21, the IC design platform 22, and the storage device 23 may be a separate device, and the user device 21, the IC design platform 22, and the storage device 23 may be connected to each other via a wired and/or wireless communication, or a network system. In an exemplary embodiment of the inventive concept, at least one of the user device 21, the IC design platform 22, and the storage device 23 may be spaced apart from each other.

The user device 21 may include a processor 21a and a user interface (UI) 21b. Based on user input data input through the user interface 21a, the processor 21a may execute an operation using the IC design platform 22. The IC design platform 22 may include a P&R module 22a, which may be a set of computer-readable instructions for designing ICs. The P&R module 22a may be configured in a similar manner to the P&R module 13a of FIG. 7.

For example, the IC design platform 22 may store instructions which are used to execute a P&R operation for designing ICs. For example, the instructions in the IC design platform 22 may instruct the processor 21a to perform operations of placing cells defining an IC, to perform a pin reordering operation on a plurality of pins in at least one of the cells, based on physical information of the pins obtained by the placing of the cells, and to perform a routing operation on the cells, on which the pin reordering operation has been performed.

The storage device 23 may include a cell library database (DB) 23a and a layout DB 23b. The cell library DB 23a may store information regarding cells used to produce an IC layout, and in particular, to store a standard cell library. The layout DB 23b may store information regarding the layout produced by the P&R module 22a (e.g., physical information regarding the layout).

Figure 9:
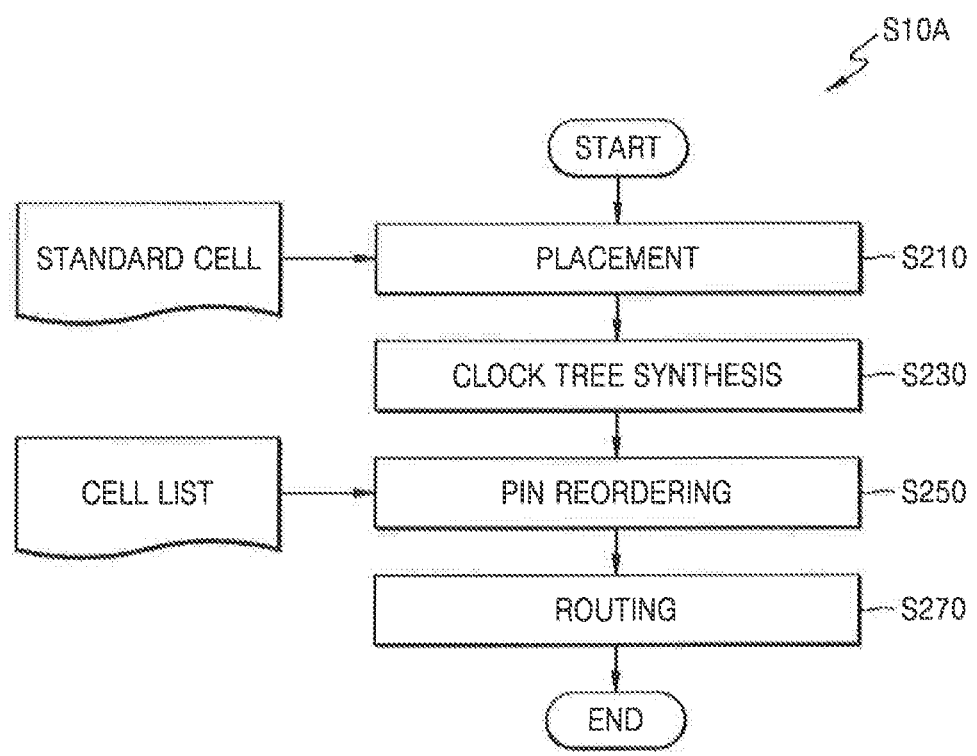
FIG. 9 is a flowchart illustrating a method of designing an integrated circuit according to an exemplary embodiment of the inventive concept.

FIG. 9 is a flowchart illustrating a method of designing an IC according to an exemplary embodiment of the inventive concept.

Referring to FIG. 9, an IC designing method S10A according to the present embodiment may be an example in which the IC designing method S10 of FIG. 1 is realized. For example, the IC designing method S10A may be performed by the processor 11 in the IC designing system 10 of FIG. 7 or by the processor 21a in the IC designing system 20 of FIG. 8. Thus, technical features of the inventive concept described with reference to FIGS. 1 to 8 may be realized in the present embodiment.

In operation S210, cells may be placed on the basis of input data defining an IC. In an exemplary embodiment of the inventive concept, a floor plan operation may be performed before operation S210. Here, the floor plan operation, which is a placement planning operation, may include making a plan on how to place and wire standard cells and macro cells in an approximate fashion. For example, in the floor plan operation, I/O cells, standard cells, RAM, and so forth may be placed on a chip. In addition, a post-placement optimization operation may be further performed after operation S210.

In operation S230, a clock tree synthesis may be performed. Here, the clock tree synthesis may automatically configure a clock network and insert a buffer at a suitable position, when an IC layout is produced. If the placement and the clock tree synthesis of operations S210 and S230 are performed, the placement of the cells may be finished.

In operation S250, the pin reordering operation may be performed on pins in at least one of the cells, based on physical information of the pins obtained by the placing of the cells. Here, at least one cell may be selected from the placed cells, based on a previously defined cell list. In an exemplary embodiment of the inventive concept, the physical information may contain information regarding positions of the pins provided in the cells. In an exemplary embodiment of the inventive concept, the physical information may contain information regarding spaces between the pins provided in the cells. In operation S270, a routing operation may be performed on the cells, on which the pin reordering operation has been performed.

Figure 10:
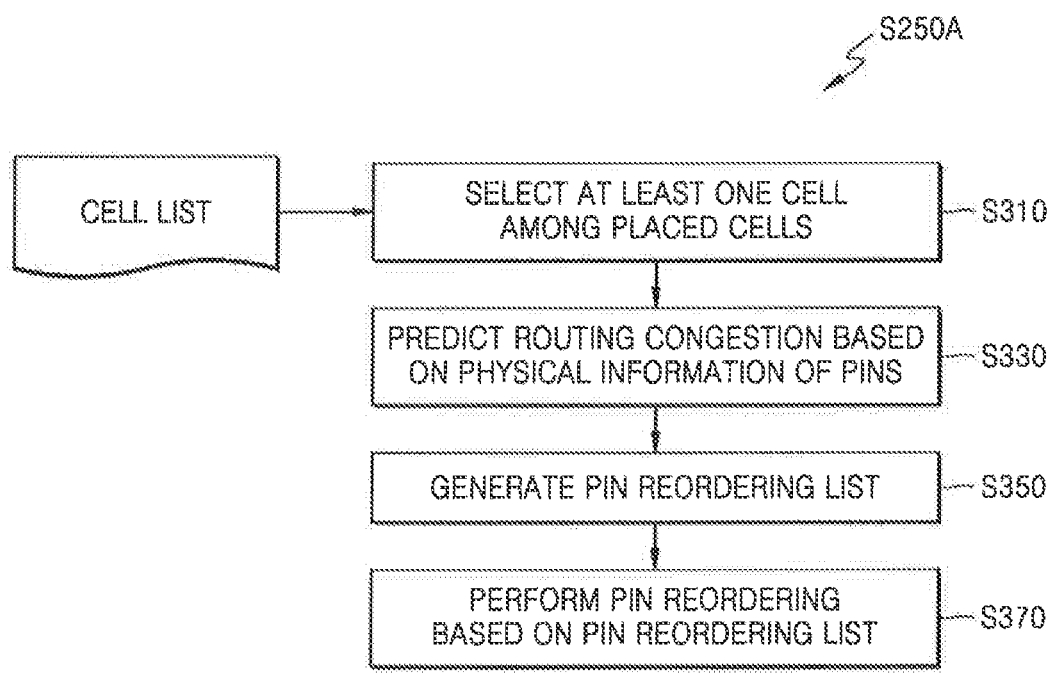
FIG. 10 is a flowchart illustrating a pin reordering method according to an exemplary embodiment of the inventive concept.

FIG. 10 is a flowchart illustrating a pin reordering method according to an exemplary embodiment of the inventive concept.

Referring to FIG. 10, a pin reordering method S250A according to the present embodiment may be an example in which the pin reordering operation S250 of FIG. 9 is realized. For example, the pin reordering method S250A may be performed by the processor 11 in the IC designing system 10 of FIG. 7 or by the processor 21a in the IC designing system 20 of FIG. 8. Thus, technical features of the inventive concept described with reference to FIGS. 1 to 9 may be realized in the present embodiment.

In operation S310, at least one cell may be selected from a plurality of placed cells, based on a previously defined cell list. Here, the cell list may be a list describing cells, to which the pin reordering operation can be applied, and may be called a 'pin reordering rule'. For example, the cell list may contain information regarding pins, which can be re-assigned by the pin reordering operation, and on cells including such pins. The pins, which can be re-assigned by the pin reordering operation, may be functionally or logically equivalent. The cell list may be defined in advance by analyzing various standard cells stored in a standard cell library. The cell list may be provided to the P&R tool and may be used as input data for the pin reordering operation.

In operation S330, routing congestion may be predicted, based on physical information regarding the pins. For example, in the case where the pin reordering operation is performed on the pins in the at least one cell selected in operation S310, it may be possible to predict whether routing congestion is reduced. In an exemplary embodiment of the inventive concept, the routing congestion may be predicted, based on the sum of lengths of wires connected to the pins, respectively. In an exemplary embodiment of the inventive concept, the routing congestion may be predicted, based on the sum of horizontal lengths of wires connected to the pins, respectively. In an exemplary embodiment of the inventive concept, the routing congestion may be predicted, based on a space between the pins. An operation of predicting the routing congestion will be described with reference to FIG. 11.

In operation S350, a pin reordering list may be generated. For example, the pin reordering list may be generated to include information regarding pins, in which routing congestion is expected to be reduced when the pin reordering operation is performed in operation S330. In operation S370, the pin reordering operation may be performed based on the pin reordering list.

Figure 11:
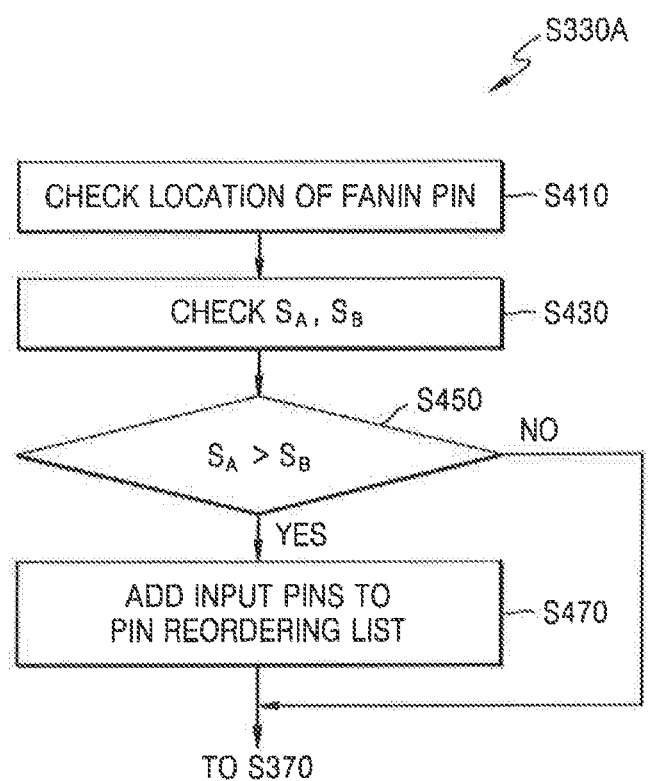
FIG. 11 is a flowchart illustrating a method of predicting a routing congestion according to an exemplary embodiment of the inventive concept.
Figure 12:
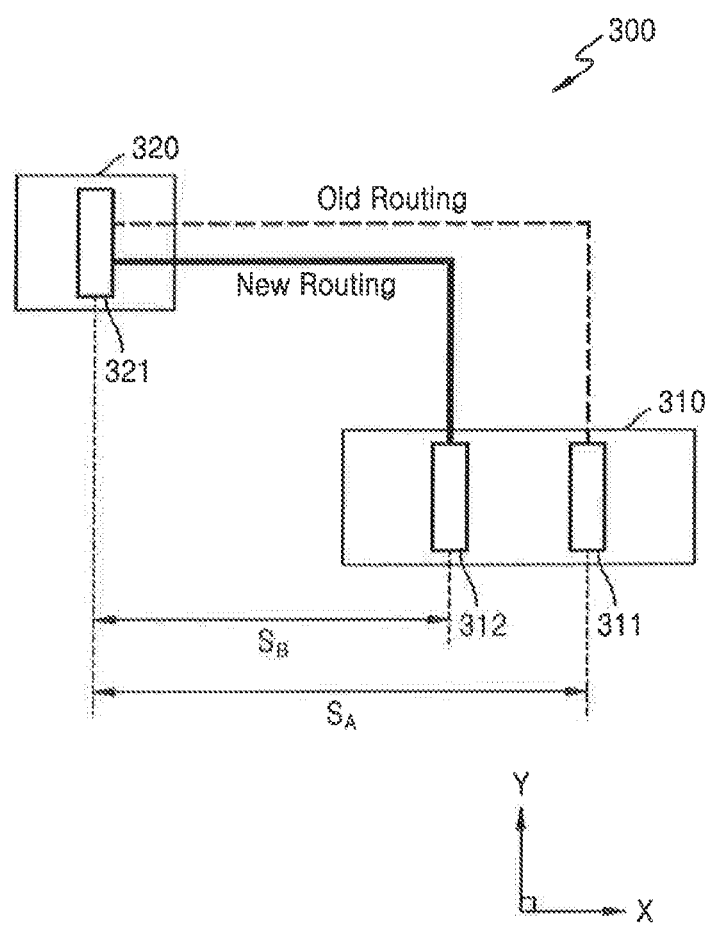
FIG. 12 illustrates a layout according to an exemplary embodiment of the inventive concept.

FIG. 11 is a flowchart illustrating a method of predicting routing congestion according to an exemplary embodiment of the inventive concept, and FIG. 12 illustrates a layout 300 according to an exemplary embodiment of the inventive concept. Hereinafter, a method of predicting routing congestion will be described with reference to FIGS. 11 and 12. The layout 300 may include first and second cells 310 and 320. The first cell 310 may include first and second input pins 311 and 312, and the second cell 320 may include a fan-in pin 321.

In the present embodiment, described is a method for predicting whether routing congestion can be reduced when the pin reordering operation is performed on the first and second input pins 311 and 312 of the first cell 310. This method may be an example of operation S330 of FIG. 10. For example, a method S330A of predicting routing congestion according to the present embodiment may be performed by the processor 11 in the IC designing system 10 of FIG. 7 or by the processor 21a in the IC designing system 20 of FIG. 8. Thus, technical features of the inventive concept described with reference to FIGS. 1 to 10 may be realized in the present embodiment.

In operation S410, a position of the fan-in pin 321, which can be connected to the first and second input pins 311 and 312 of the first cell 310, may be checked. For example, since operation S410 is performed after the placing of the first and second cells 310 and 320, the position of the fan-in pin 321 may be checked, based on information regarding the placement of the first and second cells 310 and 320.

In operation S430, a first space $S_A$ and a second space $S_B$ may be checked. Here, the first space $S_A$ may be a horizontal distance, in an X direction, between the first input pin 311 and the fan-in pin 321, when a connection structure of the pins is at a stage before the pin reordering operation. The second space $S_B$ may be a horizontal distance, in the X direction, between the second input pin 312 and the fan-in pin 321, when a pin connection structure of the pins is at a stage after the pin reordering operation.

In operation S450, the first space $S_A$ may be compared with the second space $S_B$. If the first space $S_A$ is larger than the second space $S_B$, it may be expected that the pin reordering operation leads to a reduction of the routing congestion, and in this case, operation S470 may be performed. In other words, the routing will eventually be changed from old to new. In operation S470, the first and second input pins 311 and 312 may be included in the pin reordering list. In operation S450, if the first space $S_A$ is not larger than the second space $S_B$, it may be expected that the pin reordering operation does not lead to a reduction of the routing congestion, and thus, an operation of estimating the routing congestion may be finished.

FIG. 13 illustrates a pin reordering operation according to an exemplary embodiment of the inventive concept.

Referring to FIG. 13, a first layout 400 may be a layout, which is at a stage before the pin reordering operation, and a second layout 400' may be a layout, which is at a stage after the pin reordering operation. For example, the first layout 400 may include first to third cells 410, 420, and 430. The first cell 410 may include first and second input pins 411 and 412, the second cell 420 may include a first fan-in pin 421, and the third cell 430 may include a second fan-in pin 431. According to the present embodiment, in the first layout 400, the first and second input pins 411 and 412 may be respectively assigned to a pin "A" and a pin "B", and in the second layout 400', the first and second input pins 411 and 412 may be respectively re-assigned to the pin "B" and the pin "A". In both layouts 400 and 400', the first fan-in pin 421 is assigned to a pin "X" and the second fan-in pin 431 is assigned to a pin "Y".

The first layout 400 may be produced after a cell placement operation (e.g., by operation S110 of FIG. 1). Physical information regarding a plurality of pins may be obtained from the first layout 400. For example, the physical information may contain information regarding a space x between the first and second input pins 411 and 412, a space a between the first input pin 411 and the second fan-in pin 431, and a space b between the second input pin 412 and the first fan-in pin 421.

According to the present embodiment, in the first layout 400 before the pin reordering operation, the first input pin 411 may be connected to the second fan-in pin 431, and the second input pin 412 may be connected to the first fan-in pin 421. Here, a first horizontal length of a wire connected to the first input pin 411 may be "a" and a second horizontal length of a wire connected to the second input pin 412 may be "b", and in this case, a sum D1 of the first and second horizontal lengths may be (a+b); e.g., D1=a+b.

In the second layout 400' after the pin reordering operation, the first input pin 411 may be connected to the first fan-in pin 421, and the second input pin 412 may be connected to the second fan-in pin 431. Here, a first horizontal length of a wire connected to the first input pin 411 may be (b−x), and a second horizontal length of a wire connected to the second input pin 412 may be (a−x). Thus, a sum D1' of the first and second horizontal lengths may be (a+b−2x) that is less than the sum D1 before the pin reordering operation; e.g., D1'<D1.

According to the present embodiment, in the case where the pin reordering operation is performed on the first and second input pins 411 and 412 based on physical information regarding the first and second input pins 411 and 412 and the first and second fan-in pins 421 and 431, routing congestion is expected to be reduced. Thus, the first and second input pins 411 and 412 may be added to the pin reordering list, and the pin reordering operation may be performed on the first and second input pins 411 and 412. Accordingly, it may be possible to reduce lengths of the wires connected to the first and second input pins 411 and 412 and accordingly, reduce a signal delay and the routing congestion.

FIG. 14 illustrates a pin reordering operation according to an exemplary embodiment of the inventive concept.

Referring to FIG. 14, a first layout 500 may refer to a layout, which is at a stage before the pin reordering operation, and a second layout 500' may refer to a layout, which is at a stage after the pin reordering operation. For example, the first layout 500 may include first and second cells 510 and 520, the first cell 510 may include first and second input pins 511 and 512, and the second cell 520 may include first and second fan-in pins 521 and 522.

The first layout 500 may be produced after a cell placement operation (e.g., by operation S110 of FIG. 1). Physical information regarding a plurality of pins may be obtained from the first layout 500. For example, the physical information may contain information regarding a space x between the first and second input pins 511 and 512, a space "a" between the first input pin 511 and the second fan-in pin 522, and a space "b" between the second input pin 512 and the first fan-in pin 521.

According to the present embodiment, in the first layout 500 before the pin reordering operation, the first input pin 511 may be connected to the second fan-in pin 522, and the second input pin 512 may be connected to the first fan-in pin 521. Here, a first horizontal length of a wire connected to the first input pin 511 may be "a" and a second horizontal length of a wire connected to the second input pin 512 may be "b", and in this case, a sum D2 of the first and second horizontal lengths may be (a+b); e.g., D2=a+b.

In the second layout 500' after the pin reordering operation, the first input pin 511 may be connected to the first fan-in pin 521, and the second input pin 512 may be connected to the second fan-in pin 522. Here, a first horizontal length of a wire connected to the first input pin 511 may be (b−x), and a second horizontal length of a wire connected to the second input pin 512 may be (a+x). Thus, a sum D2' of the first and second horizontal lengths may be (a+b) that is equal to the sum D2 before the pin reordering operation; e.g., D2'=D2.

According to the present embodiment, in the case where the pin reordering operation is performed on the first and second input pins 511 and 512 based on physical information regarding the first and second input pins 511 and 512 and the first and second fan-in pins 521 and 522, it may be expected that routing congestion is not reduced. Thus, the first and second input pins 511 and 512 may not be added to the pin reordering list, and the pin reordering operation may not be performed on the first and second input pins 511 and 512.

FIG. 15 illustrates a pin reordering operation according to an exemplary embodiment of the inventive concept.

Referring to FIG. 15, a first layout 600 may refer to a layout, which is at a stage before the pin reordering operation, and a second layout 600' may refer to a layout, which is at a stage after the pin reordering operation. For example, the first layout 600 may include first and second cells 610 and 620, the first cell 610 may include first and second input pins 611 and 612, and the second cell 620 may include first and second fan-in pins 621 and 622.

The first layout 600 may be produced after a cell placement operation (e.g., by operation S110 of FIG. 1). Physical information regarding a plurality of pins may be obtained from the first layout 600. For example, the physical information may contain information regarding a space x between the first and second input pins 611 and 612, a space a between the first input pin 611 and the second fan-in pin 622, and a space b between the second input pin 612 and the first fan-in pin 621.

According to the present embodiment, in the first layout 600 before the pin reordering operation, the first input pin 611 may be connected to the second fan-in pin 622, and the second input pin 612 may be connected to the first fan-in pin 621. Here, a first horizontal length of a wire connected to the first input pin 611 may be "a" and a second horizontal length of a wire connected to the second input pin 612 may be "b", and in this case, a sum D3 of the first and second horizontal lengths may be (a+b); e.g., D3=a+b.

In the second layout 600' after the pin reordering operation, the first input pin 611 may be connected to the first fan-in pin 621, and the second input pin 612 may be connected to the second fan-in pin 622. Here, a first horizontal length of a wire connected to the first input pin 611 may be (b+x), and a second horizontal length of a wire connected to the second input pin 612 may be (a−x). Thus, a sum D3' of the first and second horizontal lengths may be (a+b) that is equal to the sum D3 before the pin reordering operation; e.g., D3'=D3.

According to the present embodiment, in the case where the pin reordering operation is performed on the first and second input pins 611 and 612 based on physical information regarding the first and second input pins 611 and 612 and the first and second fan-in pins 621 and 622, it may be expected that routing congestion is not reduced. Thus, the first and second input pins 611 and 612 may not be added to the pin reordering list, and the pin reordering operation may not be performed on the first and second input pins 611 and 612.

Figure 16A:
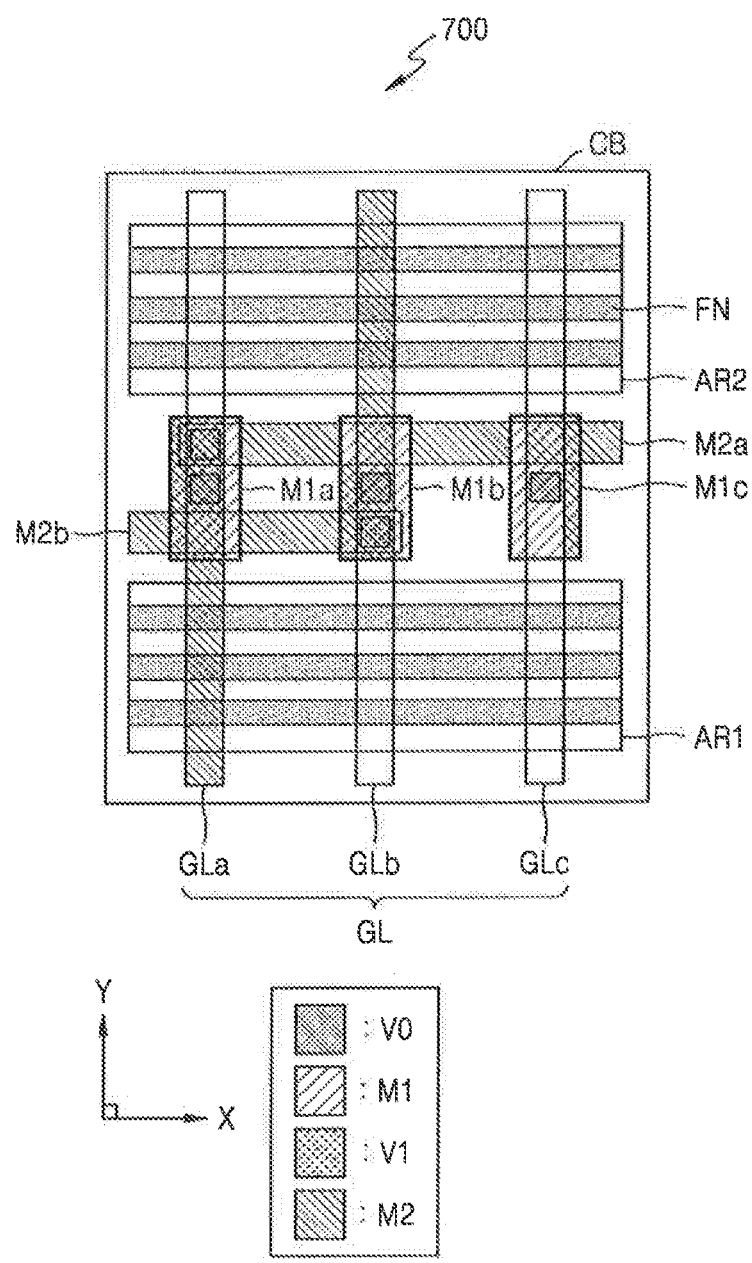
FIGS. 16A and 16B are first and second layouts illustrating a standard cell that is included in an integrated circuit according to an exemplary embodiment of the inventive concept.
Figure 16B:
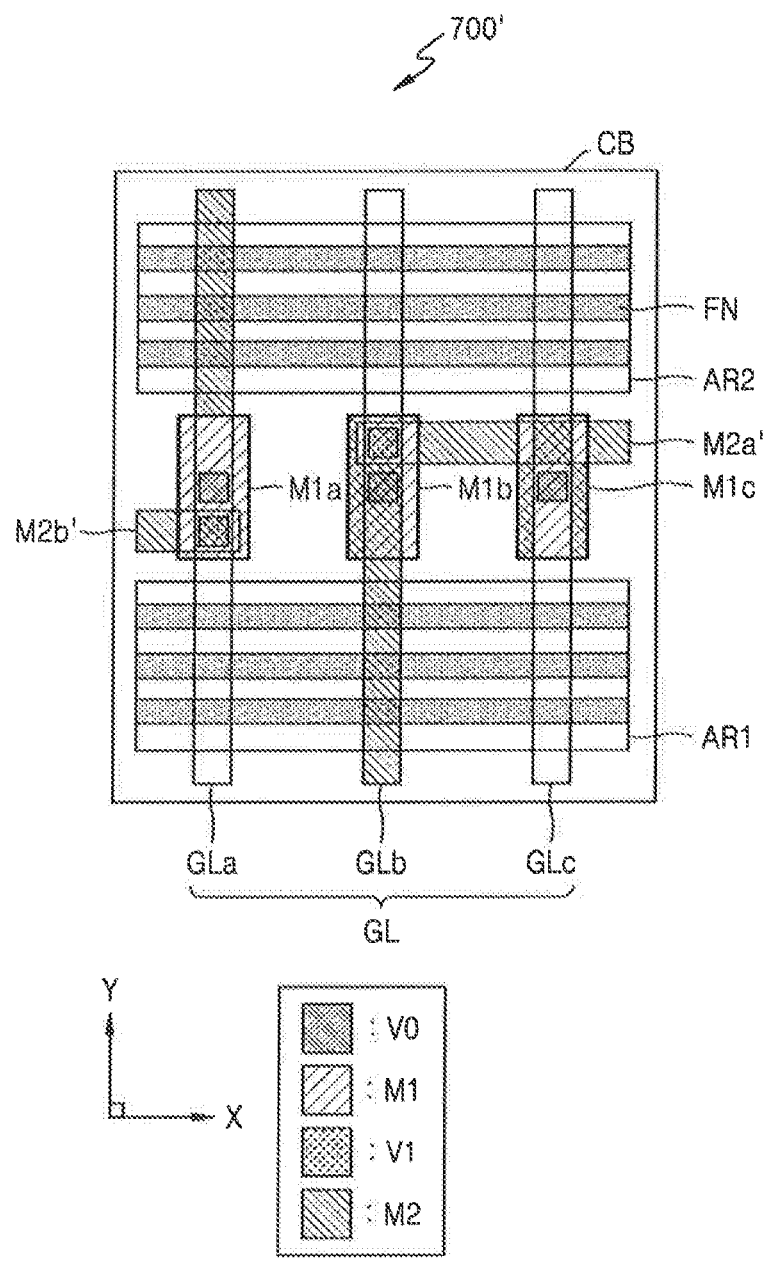

FIGS. 16A and 16B are first and second layouts 700 and 700' illustrating a standard cell that is included in an IC according to an exemplary embodiment of the inventive concept.

Referring to FIGS. 16A and 16B, the first layout 700 may refer to a layout, which is at a stage before the pin reordering operation, and the second layout 700' may refer to a layout, which is at a stage after the pin reordering operation. According to the present embodiment, in the first layout 700, first metal lines M1*a* and M1*b* may be respectively assigned to a pin "A" and a pin "B", and in the second layout 700', the first metal lines M1*a* and M1*b* may be respectively re-assigned to the pin "B" and the pin "A".

In the first layout 700, the standard cell may be delimited by a cell boundary CB and may include a plurality of fins FN, first and second active regions AR1 and AR2, a plurality of gate lines GL (e.g., GLa, GLb, and GLc), a plurality of first metal lines M1 (e.g., M1a, M1b, and M1c), and a plurality of second metal lines M2 (e.g., M2a and M2b). The cell boundary CB may serve as an outline that delimits the standard cell and allows a P&R tool (e.g., 13a of FIG. 7 or 22a of FIG. 8) to perceive the standard cell. The cell boundary CB may consist of four boundary lines.

The plurality of fins FN may extend in an X direction and may be arranged along a Y direction, which is perpendicular to the X direction, to be parallel to each other. The first active region AR1 and the second active region AR2 may be disposed to be parallel to each other and may have different conductivity types from each other. In the present embodiment, three fins FN may be disposed in each of the first and second active regions AR1 and AR2, but the inventive concept is not limited thereto. For example, the number of the fins FN to be disposed in each of the first and second active regions AR1 and AR2 may be variously changed.

Here, the plurality of fins FN provided in the first and second active regions AR1 and AR2 may be called 'active fins'. Although only the active fins are illustrated in FIGS. 16A and 16B, the inventive concept is not limited thereto. For example, the standard cell may further include dummy fins that are disposed between the cell boundary CB and the first active region AR1, between the first and second active regions AR1 and AR2, or between the second active region AR2 and the cell boundary CB.

The plurality of gate lines GLa, GLb, and GLc may extend in the Y direction and may be arranged along the X direction to be parallel to each other. Here, the gate lines GLa, GLb, and GLc may be formed of or include an electrically conductive material (e.g., polysilicon, metal, metal alloys, and so forth). The structure of the standard cell may not be limited to an example of FIGS. 16A and 16B, in which three gate lines GLa, GLb, and GLc are provided. For example, the standard cell may include four or more gate lines that extend in the Y direction and are arranged along the X direction to be parallel to each other.

First vias V0 may be disposed on the plurality of gate lines GLa, GLb, and GLc, respectively, and may be used to electrically connect the plurality of gate lines GLa, GLb, and GLc to the plurality of first metal lines M1a, M1b, and M1c, respectively. Here, the first vias V0 may be formed of or include an electrically conductive material (e.g., polysilicon, metal, metal alloys, and so forth).

The plurality of first metal lines M1a, M1b, and M1c may be disposed to constitute a layer on the gate lines GLa, GLb, and GLc. For example, the first metal line M1a may correspond to the first input pin 411 of FIG. 13, and the first metal line M1b may correspond to the second input pin 412 of FIG. 13. Here, the first metal lines M1a, M1b, and M1c may be formed of or include an electrically conductive material (e.g., polysilicon, metal, metal alloys, and so forth).

The first metal lines M1a, M1b, and M1c may extend in the Y direction and may be arranged along the X direction to be parallel to each other, but the inventive concept is not limited thereto. For example, at least one of the first metal lines M1a, M1b, and M1c may include two portions extending in the X and Y directions, respectively, thereby having an 'L'-shaped structure. The structure of the standard cell may not be limited to an example of FIGS. 16A and 16B, in which the standard cell is illustrated to include three first metal lines M1a, M1b, and M1c. For example, the standard cell may be configured to include four or more first metal lines.

Second vias V1 may be disposed on the plurality of first metal lines M1a and M1b, respectively, and may be used to electrically connect the plurality of first metal lines M1a and M1b to the plurality of second metal lines M2a and M2b, respectively. Here, the second vias V1 may be formed of or include an electrically conductive material (e.g., polysilicon, metal, metal alloys, and so forth).

The plurality of second metal lines M2a and M2b may be disposed to constitute a layer on the first metal lines M1a, M1b, and M1c. For example, the second metal line M2a may be connected to the second fan-in pin 431 of FIG. 13, and the second metal line M2b may be connected to the first fan-in pin 421 of FIG. 13. Here, the second metal lines M2a and M2b may be formed of or include an electrically conductive material (e.g., polysilicon, metal, metal alloys, and so forth).

The second metal lines M2a and M2b may extend in the X direction, but the inventive concept is not limited thereto. For example, in an exemplary embodiment of the inventive concept, at least one of the second metal lines M2a and M2b may include two portions extending in the X and Y directions, respectively, thereby having an 'L'-shaped structure. The structure of the standard cell may not be limited to an example of FIGS. 16A and 16B, in which the standard cell is illustrated to include two second metal lines M2a and M2b. For example, the standard cell may be configured to include three or more second metal lines.

According to the present embodiment, lengths, in the X direction, of the second metal lines M2a and M2b connected to the first metal lines M1a and M1b, respectively, may be used to predict whether routing congestion is reduced by the pin reordering operation to be performed on the first metal lines M1a and M1b. In the case where it is expected that the routing congestion is reduced by the pin reordering operation to be performed on the first metal lines M1a and M1b, the pin reordering operation may be performed on the first metal lines M1a and M1b, and as a result, the second layout 700' may be produced.

According to the second layout 700', the first metal line M1a may be connected to the second metal line M2b', and the first metal line M1b may be connected to the second metal line M2a'. Accordingly, the length, in the X direction, of each of the second metal lines M2a' and M2b' may be shortened. As a result, it may be possible to reduce routing congestion and prevent a signal delay issue from occurring.

According to an exemplary embodiment of the inventive concept, as described with reference to FIGS. 1 to 16B, in operation of designing an IC layout, the pin reordering operation may be performed on pins in at least one of the cells, based on physical information regarding the pins that are determined by the placing of the cells. This may make it possible to substantially reduce routing congestion. In addition, owing to the reduction in length of the wire, it may be possible to improve a timing Quality of Result (QoR).

Figure 17:
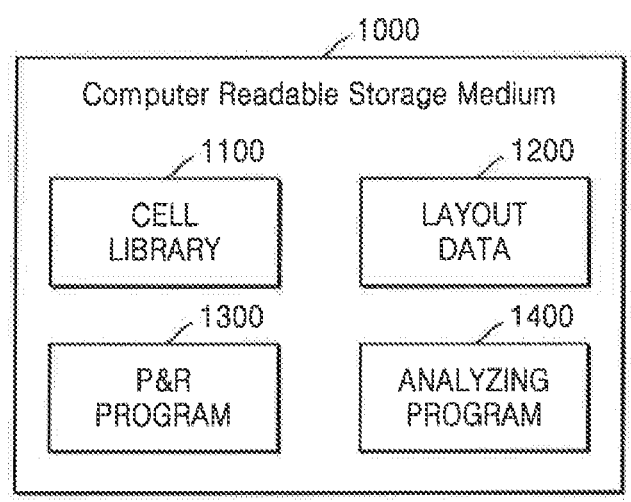
FIG. 17 is a block diagram illustrating a storage medium according to an exemplary embodiment of the inventive concept.

FIG. 17 is a block diagram illustrating a storage medium according to an exemplary embodiment of the inventive concept.

Referring to FIG. 17, a storage medium 1000 may store a cell library 1100, a layout data 1200, a P&R program 1300, and an analysis program 1400. The storage medium 1000 may be a computer-readable storage medium and may include a storage medium whose data can be read by a computer during an operation of providing instructions and/or data to the computer. For example, the storage medium 1000 may include a magnetic or optical medium (e.g., disk, tape, compact disc read only memory (CD-ROM), digital versatile disc ROM (DVD-ROM), CD recordable (CD-R), CD rewritable (RW) (CD-RW), DVD-R, or DVD-RW), a volatile or nonvolatile memory (e.g., RAM, ROM, or FLASH memory), a nonvolatile memory allowing for an access via a universal serial bus (USB) interface, and microelectromechanical systems (MEMS). The computer-readable storage medium may be inserted into a computer, may be integrated as a part of the computer, or may be coupled to the computer via a communication system (e.g., network and/or wireless link).

The cell library 1100 may be a standard cell library and may contain information regarding a standard cell which is a unit constituting an IC. In an exemplary embodiment of the inventive concept, the information regarding the standard cell may include layout information that is used to produce a layout. In an exemplary embodiment of the inventive concept, the information regarding the standard cell may contain timing information used for a verification or simulation of the layout. In an exemplary embodiment of the inventive concept, the information regarding the standard cell may include a cell list, in which target cells of the pin reordering operation are defined.

The layout data 1200 may contain physical information regarding the layout that is produced by the P&R operation. In an exemplary embodiment of the inventive concept, the layout data 1200 may include information regarding widths, lengths, and spaces of conductive and insulating patterns. In an exemplary embodiment of the inventive concept, the layout data 1200 may further include a pin reordering list.

The P&R program 1300 may include a plurality of instructions, which are used to execute a method of producing an IC layout using a standard cell library according to exemplary embodiments of the inventive concept. For example, the P&R program 1300 may instruct the processor 11 to perform operations of placing cells defining an IC, to perform a pin reordering operation on a plurality of pins in at least one of the cells, based on physical information of the pins obtained by the placing of the cells, and to perform a routing operation on the cells, on which the pin reordering operation has been performed. For example, the P&R program 1300 may be used to execute operations S110 to S130 of FIG. 1, operations S210 to S270 of FIG. 9, operations S310 to S370 of FIG. 10, or operations S410 to S470 of FIG. 11.

The analysis program 1400 may include a plurality of instructions, which are used to execute a process of analyzing an IC based on input data defining the IC. In an exemplary embodiment of the inventive concept, the analysis program 1400 may be a timing analysis program or a power analysis program. For example, the analysis program 1400 may be a Static Timing Analysis (STA) program. The STA program may be a simulation method for calculating an expected timing of a digital circuit and may perform a timing analysis on all timing paths of placed standard cells and output results of the timing analysis.

In exemplary embodiments of the inventive concept, the storage medium 1000 may also be used to store a data structure. The data structure may include a storage space for managing data that may be produced in a process of: using a standard cell library contained in the cell library 1100, extracting specific information from a standard cell library contained in the cell library 1100, or analyzing properties of an IC using an analysis program.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A method of manufacturing an integrated circuit, wherein at least a portion of the method is performed by a processor, the method comprising:
    placing cells including fins, extending in a first direction based on input data defining the integrated circuit;
    performing a pin reordering operation on a plurality of pins in a first cell of the cells, based on physical distances between the plurality of pins in the first cell and a plurality of pins in other cells of the cells, wherein the physical distances are determined based on the placement of the cells;
    performing a routing operation on the cells, after the pin reordering operation; and
    manufacturing the integrated circuit, based on a layout produced by the routing operation,
    wherein the pins in the first cell comprise first and second pins that are logically equivalent, and
    the pin reordering operation is performed on the first and second pins, based on the physical distances, so that a sum of first direction lengths of first and second wires to be respectively connected to the first and second pins is reduced, the first direction lengths correspond to lengths in the first direction.

2. The method of claim 1, wherein the physical distances include a distance between the first pin of the plurality of pins in the first cell and a third pin in a second cell.

3. The method of claim 1, wherein the first and second pins are input pins of the first cell and are respectively connectable to first and second fan-in pins that are provided outside the first cell, and
    the physical distances include a first distance between the first pin and the first fan-in pin, a second distance between the first pin and the second fan-in pin, a third distance between the second pin and the first fan-in pin, and a fourth distance between the second pin and the second fan-in pin.

4. The method of claim 1, further comprising performing a clock tree synthesis on the cells, after the placing of the cells and before the performing of the pin reordering operation.

5. The method of claim 1, wherein the pin reordering operation comprises:
    selecting the first cell from the placed cells, based on a previously defined cell list;
    predicting whether routing congestion is reduced when the pin reordering operation is performed on the pins in the selected first cell; and
    adding the pins to a pin reordering list, based on a result of the prediction.

6. The method of claim 5, wherein the pin reordering operation further comprises performing a pin reordering on a plurality of pins in the cells, based on the pin reordering list.

7. The method of claim 5, wherein the selecting of the first cell from the cells is performed to select a cell, which is included in the cell list, and use the selected cell as the first cell.

8. The method of claim 5, wherein
    the first and second pins are configured to be connectable to a fan-in pin provided outside the first cell, and
    the predicting whether routing congestion is reduced comprises:

checking a first space between the first pin and the fan-in pin;
checking a second space between the second pin and the fan-in pin; and
comparing the first and second spaces with each other.

9. An integrated circuit designing system, comprising:
a processor; and
a memory connected to the processor and configured to store instructions, wherein the instructions are used to perform a placement and routing operation for designing an integrated circuit,
wherein the instructions are configured to instruct the processor to perform operations to: place cells including fins, extending in a first direction, based on input data defining the integrated circuit, perform a pin reordering operation on a plurality of pins in a first cell of the cells, based on physical distances between the pins in the first cell and a plurality of pins in a plurality of pins of other cells of the cells, and perform a routing operation on the cells, on which the pin reordering operation has been performed,
wherein the pins in the first cell comprise first and second pins that are logically equivalent, and
the pin reordering operation is performed on the first and second pins, based on the physical distances, so that a sum of first direction lengths of first and second wires to be respectively connected to the first and second pins is reduced, the first direction lengths correspond to lengths in the first direction.

10. The system of claim 9, wherein the first and second pins are configured to be respectively connectable to first and second fan-in pins that are provided outside the first cell, and
the physical distances include a first distance between the first pin and the first fan-in pin, a second distance between the first pin and the second fan-in pin, a third distance between the second pin and the first fan-in pin, and a fourth distance between the second pin and the second fan-in pin.

11. A method of manufacturing an integrated circuit, comprising:
arranging cells including fins, extending in a first direction, in a first layout on a chip, wherein, in the first layout, a first cell has first and second pins being logically equivalent, the first pin to be wired to a first pin of a second cell and the second pin to be wired to a first pin of a third cell;
reordering the first pin of the first cell to be wired to the first pin of the third cell and the second pin of the first cell to be wired to the first pin of the second cell, wherein the first and second pins of the first cell are reordered based on their locations with respect to the second and third cells in the first layout, so that a sum of first direction lengths of first and second wires to be respectively connected to the first and second pins is reduced, the first direction lengths corresponding to lengths in the first direction;
performing a routing operation on the first, second and third cells to produce a second layout according to the reordering, wherein, in the second layout, the first pin of the first cell is to be wired to the first pin of the third cell and the second pin of the first cell is to be wired to the first pin of the second cell; and
manufacturing the integrated circuit based on the second layout.

12. The method of claim 11, wherein the first pin of the first cell is closer to the first pin of the third cell than to the first pin of the second cell.

13. The method of claim 11, wherein expected wiring between the first pin of the first cell and the first pin of the third cell is shorter than expected wiring between the first pin of the first cell and the first pin of the second cell.

14. The method of claim 11, wherein the first and second pins of the first cell are logically equivalent input pins.

15. The method of claim 14, wherein the first pin of the second cell and the first pin of the third cell are fan-in pins.

* * * * *